(12) United States Patent
Kamikawa et al.

(10) Patent No.: US 6,578,592 B1
(45) Date of Patent: Jun. 17, 2003

(54) PROCESSING APPARATUS WITH HORIZONTALLY MOVABLE ENCLOSING ELEMENT

(75) Inventors: Yuji Kamikawa, Tosu (JP); Takehiko Orii, Nirasaki (JP); Kyouji Kohama, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 120 days.

(21) Appl. No.: 09/783,957

(22) Filed: Feb. 16, 2001

(30) Foreign Application Priority Data

Feb. 16, 2000 (JP) .......................... 2000-038423

(51) Int. Cl.7 ............................ B08B 3/02; B05C 15/00
(52) U.S. Cl. .................... 134/200; 134/902; 118/501
(58) Field of Search ........................ 134/2, 200, 902; 118/501; 414/935–941; 216/2, 92

(56) References Cited

U.S. PATENT DOCUMENTS

| 4,300,581 A | * | 11/1981 | Thompson | 134/140 |
| 5,022,419 A | * | 6/1991 | Thompson et al. | 134/102.1 |
| 5,569,330 A | * | 10/1996 | Schild et al. | 134/1 |
| 5,902,402 A | * | 5/1999 | Durst et al. | 118/423 |
| 6,158,141 A | * | 12/2000 | Asada et al. | 134/25.4 |
| 6,158,449 A | * | 12/2000 | Kamikawa | 134/140 |

FOREIGN PATENT DOCUMENTS

JP          11031676 A     *   2/1999

* cited by examiner

*Primary Examiner*—Randy Gulakowski
*Assistant Examiner*—Joseph L Perrin
(74) *Attorney, Agent, or Firm*—Smith, Gambrell & Russell, LLP

(57) ABSTRACT

A cleaning system has a movable outer tubular member (26) and a movable inner tubular member (27). A bottom part of the inner tubular (27) is inclined. A first drain pipe (47) is connected to the inner tubular member (27). The first drain pipe (47) has an end part slidably inserted into a second drain pipe (76).

23 Claims, 14 Drawing Sheets

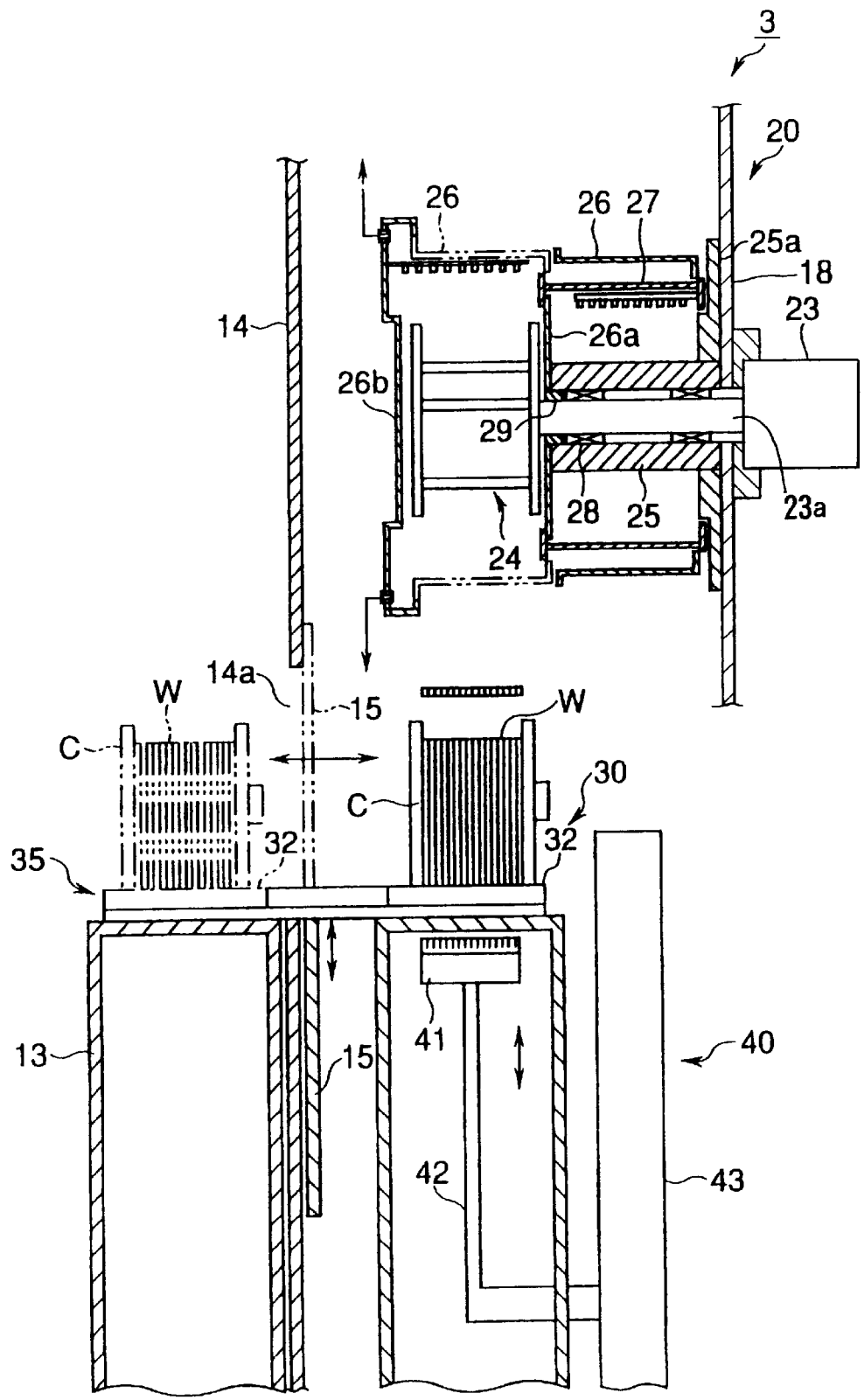
F I G. 3

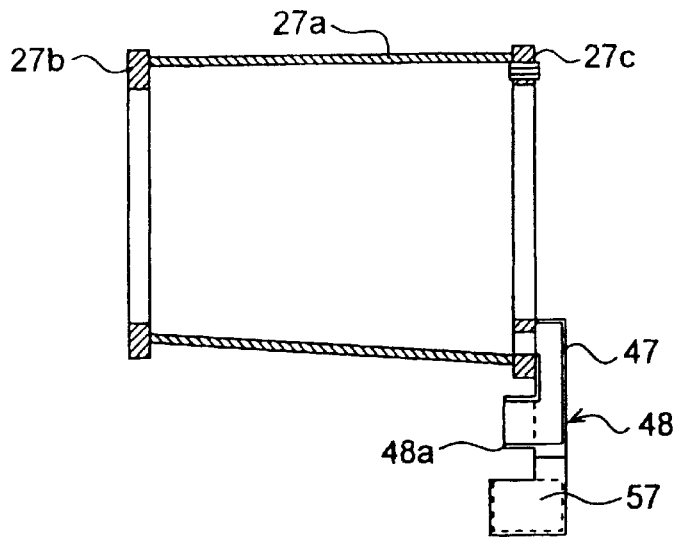
F I G. 9
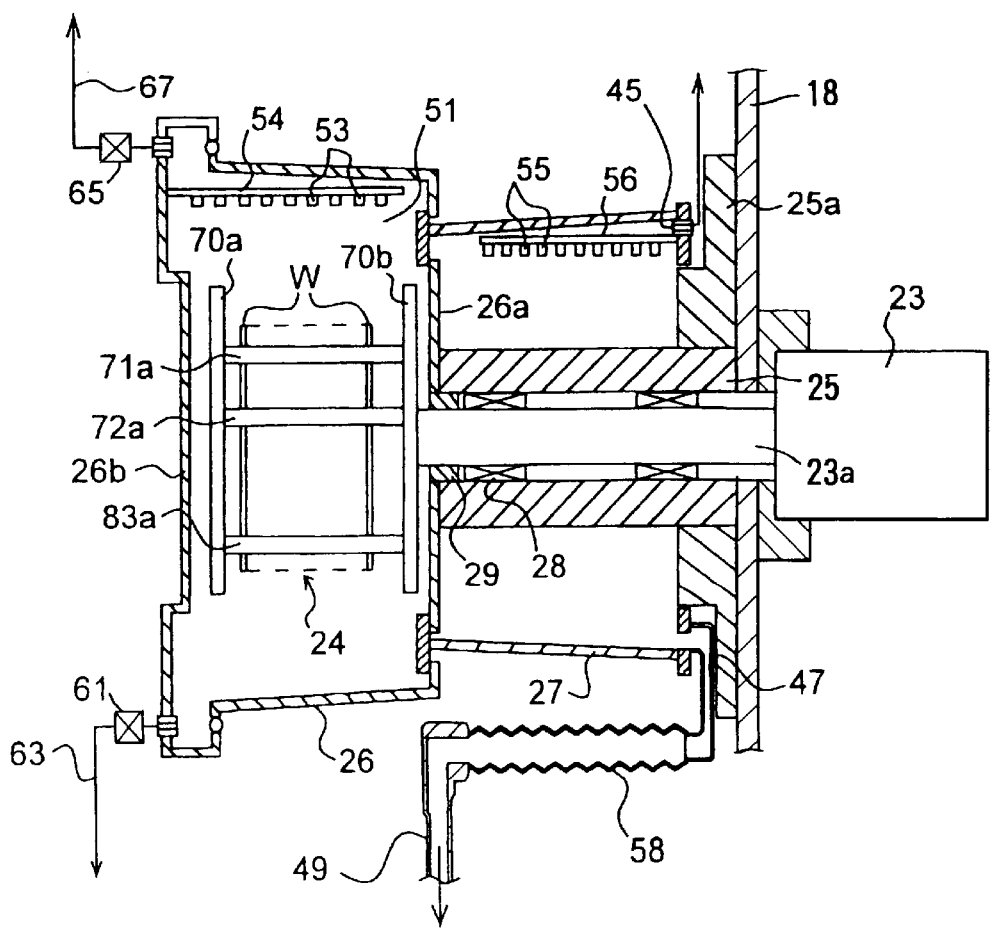
F I G. 10

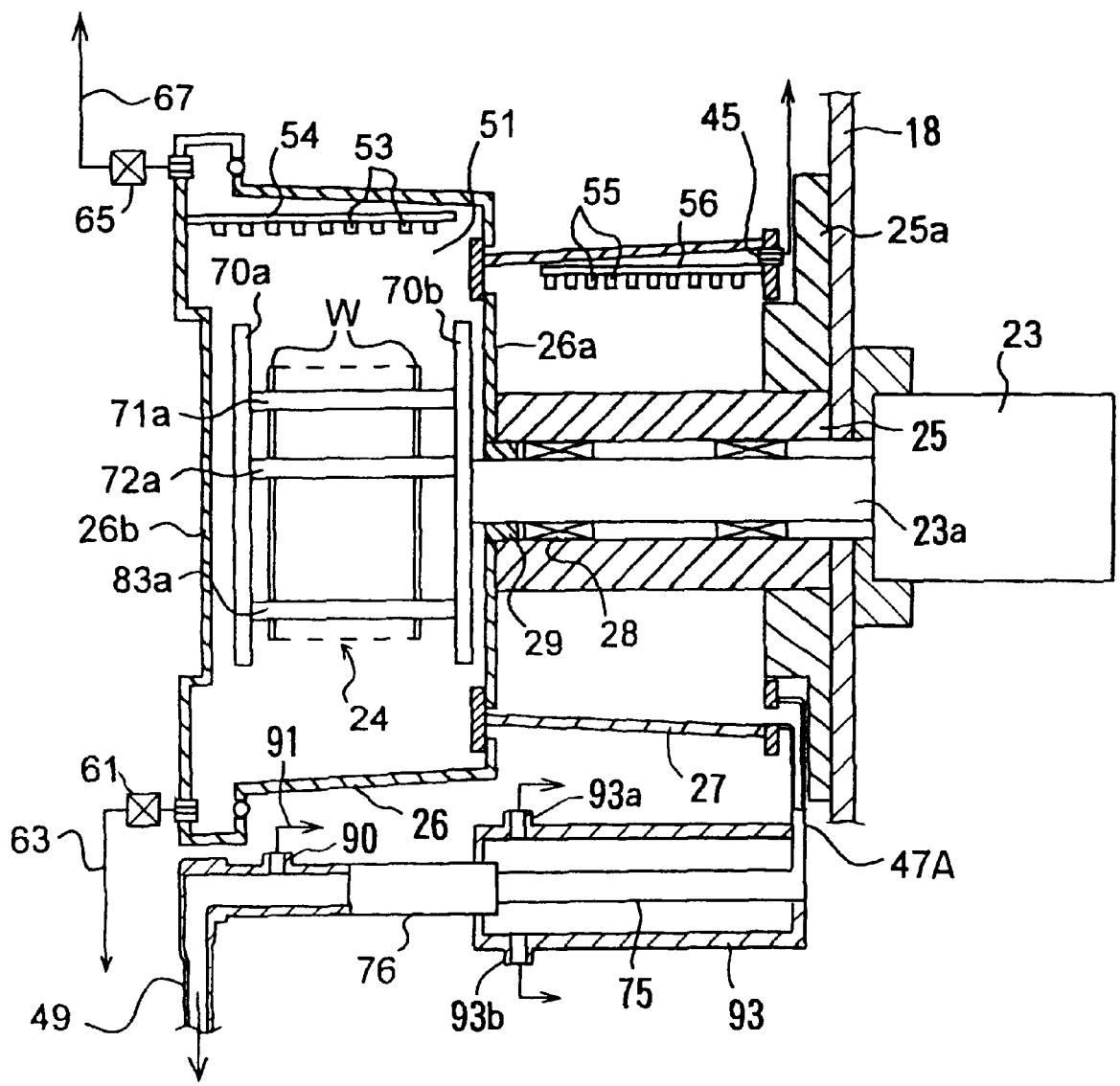
FIG. IIC

PROCESSING APPARATUS WITH HORIZONTALLY MOVABLE ENCLOSING ELEMENT

BACKGROUND OF THE INVENTION

1. Field of the Invention

The present invention relates to a processing apparatus for processing an object, such as semiconductor wafers, by a processing liquid.

2. Description of the Related Art

A semiconductor device fabricating process uses a wafer cleaning system that cleans semiconductor wafers (hereinafter referred to simply as "wafers") with a chemical liquid or pure water to clean the wafers of contaminants including organic contaminants and metallic impurities, and a wafer drying system that removes liquid drops from wafers by using an inert gas, such as $N_2$ gas, or a volatile, highly hydrophilic IPA vapor (isopropyl alcohol vapor) to dry the wafers. There are known Batch-type cleaning systems and batch-type drying systems that process a plurality of wafers in a cleaning chamber and in a drying chamber, respectively.

Wafer cleaning systems are disclosed in the U.S. Pat. Nos. 5,784,797 and 5,678,320. In the wafer cleaning systems, a wafer chuck supported on a wafer carrying arm is moved from a side in front of a wafer cleaning chamber (the front side of a rotor) through a doorway formed in a front wall of the wafer cleaning chamber and facing the wafer carrying arm into the wafer cleaning chamber, the wafers held by the wafer chuck are transferred to the rotor and the wafers are transferred from the rotor to the wafer chuck.

A known wafer cleaning section 200 shown in FIG. 16 has a cylindrical vessel 202 defining a cleaning chamber 201. A rotor 205 capable of holding wafers W and of rotation can be moved through an opening 203 formed in the front end of the cylindrical vessel 202 into and out of the cylindrical vessel 202. With the rotor 205 disposed outside the cylindrical vessel 202, the wafers W can be transferred between the rotor 205 and the gripping members 209a and 209b of the carrying arm. In FIG. 16, indicated at 207 is a driving mechanism that moves the rotor 205 axially and rotates the same, at 208 is a rotary shaft, at 204 is a lid for closing the opening 203 of the cylindrical vessel 202 and at 206 are holding members included in the rotor 205.

The wafer cleaning systems disclosed in the U.S. Pat. Nos. 5,784,797 and 5,678,320 need to secure a space sufficient for the wafer chuck to operate in the cleaning chamber and hence the size of the cleaning chamber must be increased accordingly. Since the wafer chuck operates in a limited space in the cleaning chamber, the operation of the wafer chuck must be carefully controlled so that the wafer chuck may not collide against the wall of the cleaning vessel. Consequently, the wafer carrying arm must execute complicated operations and a control program for controlling the wafer carrying arm is inevitably complicated.

Although the wafer chuck of the known wafer cleaning system 200 shown in FIG. 16 does not need to operate in a limited space, the wafer chuck must be controlled so that the gripping members 209a and 209b may not collide against the holding members 206 of the rotor 205. Consequently, a complicated control program is necessary for controlling the wafer chuck.

To solve such problems, the applicant of the present invention patent application proposed a cleaning system and filed U.S. patent application Ser. No. 09/635,465 (corresponding to Japanese Patent Application No. Hei 11-326084). This previously proposed cleaning system is formed in small dimensions, has a movable enclosing elements defining a processing chamber, and is capable of facilitating control and efficiently carrying out processes. This cleaning system discharges a processing liquid through a vertical wall 26b (FIG. 15) on the front side of a processing chamber. However, this previously proposed cleaning system causes new problems including taking long time for separating the atmosphere in the processing chamber from the ambient atmosphere and for replacing wafers.

SUMMARY OF THE INVENTION

It is an object of the present invention to incorporate further improvements into the enclosing element and the draining system of the apparatus proposed in co-pending U.S. patent application Ser. No. 09/634,465.

To achieve the object, the present invention provides with a processing apparatus for processing an object, such as a semiconductor wafer, with processing liquid. The apparatus includes: a holder that holds the object; an enclosing element capable of moving between a first position where the enclosing element surrounds the holder and forms a closed processing chamber in which the object is processed and a second position where the enclosing element is withdrawn from around the holder, the enclosing element having a first end on a side of the first position and a second end on a side of the second position, and the enclosing element being provided with a drain port, through which the processing liquid is drained, at a lowermost portion of the second end of the enclosing element; a drain pipe connected to the drain port; and a nozzle that supplies the processing liquid into the processing chamber.

The drain pipe may be configured so that it moves together with the enclosing element. In this case, preferably, the processing apparatus further includes a second drain pipe capable of receiving the processing liquid drained through the first drain pipe connected to the drain port, wherein the positional relationship between the first drain pipe and the second drain pipe changes according to a movement of the enclosing element.

The present invention also provides with a processing apparatus for processing an object, such as a semiconductor wafer, with a processing liquid, which includes an enclosing element capable of forming a closed processing chamber in which the object is processed, the enclosing element having a first end and a second end opposed each other, the enclosing element having a bottom portion sloped down at an angle of not less than 3 degree with respect to a horizontal plane, from the first end toward the second end.

The present invention further provides with a processing apparatus for processing an object, such as a semiconductor wafer, with a processing liquid, which includes a holder that holds the object; an enclosing element capable of surrounding the holder and forming a closed processing chamber in which the object is processed; and a nozzle that supplies a processing liquid into the processing chamber, wherein, as viewed in a direction of a center axis of the disk when the object is held by the holder, the nozzle is arranged in the processing chamber in a region above a horizontal diametrical line passing a center of the disk and outside of a vertical line passing intersection of the horizontal diametrical line and outer periphery of the object.

BRIEF DESCRIPTION OF THE DRAWINGS

FIG. 3 is a sectional view of a cleaning unit included in the cleaning apparatus shown in FIG. 2;

FIG. 9 is a sectional view of a structure in which a trough is disposed below the first drain pipe shown in FIG. 7;

FIG. 10 is a sectional view of another embodiment of the cleaning section, in which a first drain pipe and a second drain pipe are connected by a flexible pipe;

FIG. 11C is a sectional view of a modification of the cleaning section of FIG. 11;

DESCRIPTION OF THE PREFERRED EMBODIMENTS

A preferred embodiment of the present invention will be described with reference to the accompanying drawings. The present invention will be described as applied to an integrated wafer cleaning apparatus that carries out continuously all the operations for carrying in, cleaning, drying and delivering semiconductor wafers in a batch processing apparatus.

Figure 1:
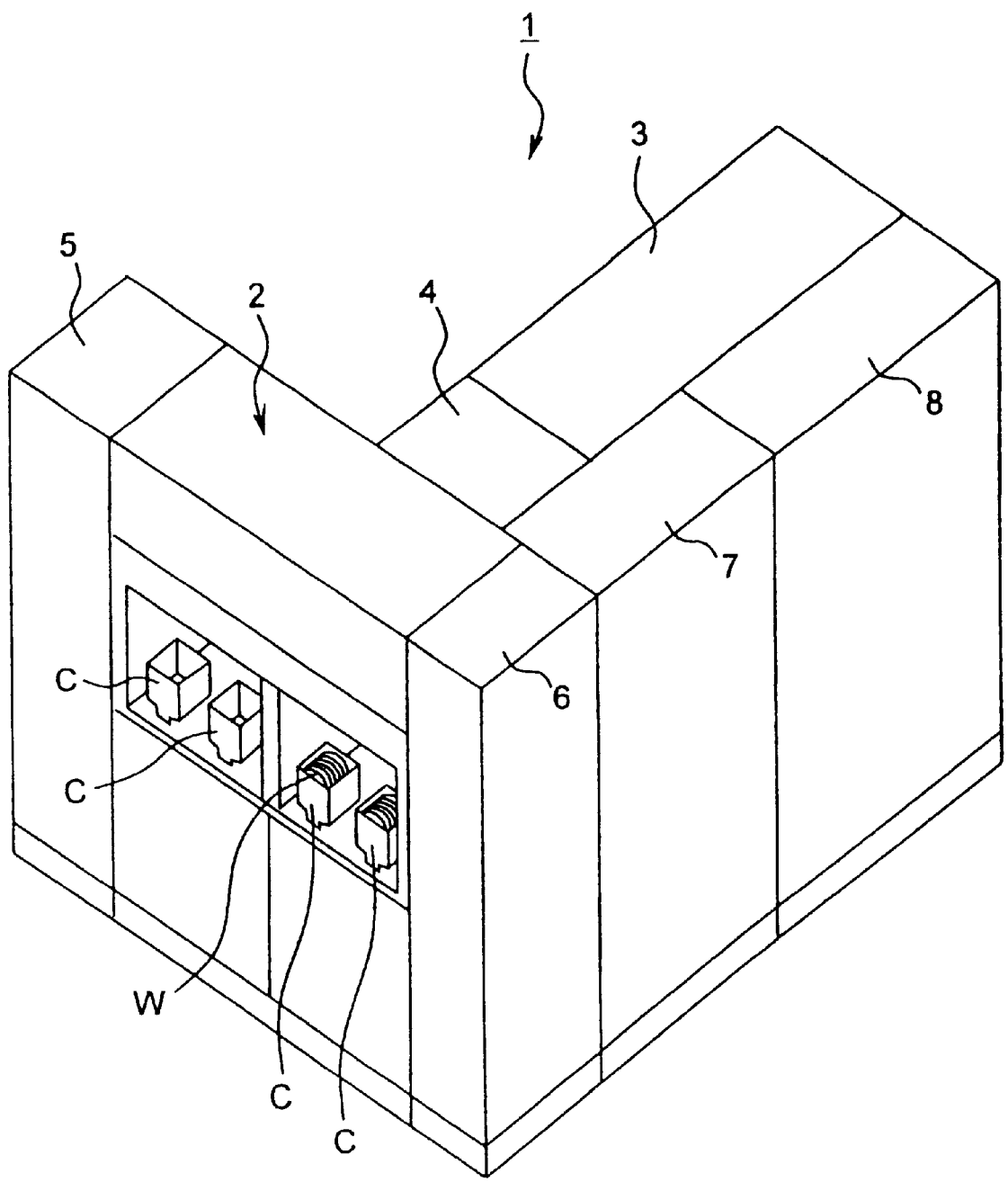
FIG. 1 is a perspective view of a cleaning apparatus in a preferred embodiment according to the present invention.
Figure 2:
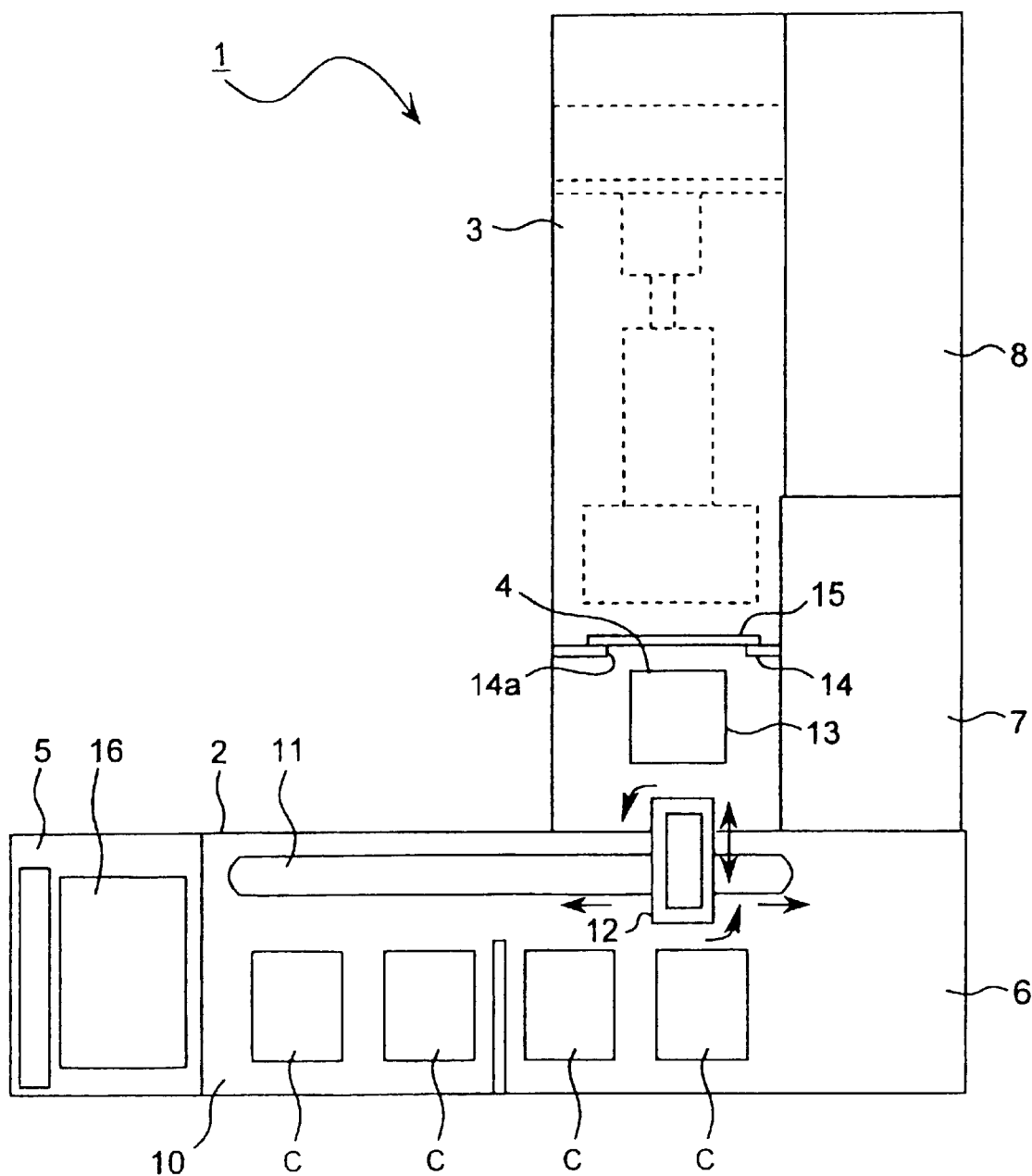
FIG. 2 is a plan view of the cleaning apparatus shown in FIG. 1.

Referring to FIGS. 1 and 2, the wafer cleaning apparatus 1 has a wafer carrier receiving/delivering unit (container receiving/delivering unit) 2 for receiving and delivering a wafer carrier C containing wafers W, a cleaning unit 3 for cleaning wafers W, a loading/unloading unit 4 interposed between the receiving/delivering unit 2 and the cleaning unit 3 to carry a wafer carrier C into and out of the cleaning unit 3, a wafer carrier cleaning unit 5 for cleaning a wafer carrier C, and a wafer carrier storage unit 6 for storing a plurality of wafer carriers C. Indicated at 7 is a power unit and at 8 is a chemical tank box.

The receiving/delivering unit 2, so-called in/out port, is provided with a stage 10 capable of supporting four wafer carriers C, i.e., a wafer container, thereon and a wafer carrier carrying mechanism 12. The wafer carrier carrying mechanism 12 moves along a carrying path 11 extending along a line on which wafer carriers C are arranged. The wafer carrier carrying mechanism 12 carries a wafer carrier C from the stage 10 to the loading/unloading unit 4 and carries a wafer carrier C from the loading/unloading unit 4 to the stage 10. A wafer carrier C is capable of containing twenty-six or twenty-five wafers W in a vertical position.

The loading/unloading unit 4 has a stage 13 for supporting a wafer carrier C thereon. A wafer carrier C transferred from the receiving/delivering unit 2 onto the stage 13 is carried by the wafer carrier carrying mechanism 12 employing a cylinder actuator, which will be described later, into the cleaning unit 3. The wafer carrier carrying mechanism 12 carries the wafer carrier C from the cleaning unit 3 onto the stage 13.

Since a wafer carrier C is carried from the stage 10 to the stage 13 by turning an arm included in the wafer carrier carrying mechanism 12, the wafer carrier C placed on the stage 13 faces a direction opposite a direction in which the wafer carrier C faces on the stage 10. Therefore, the direction in which the wafer carrier C faces on the stage 13 is reversed by a reversing mechanism, not shown.

The cleaning unit 3 and the loading/unloading unit 4 are separated by a partition wall 14 provided with an opening 14a through which a wafer carrier C is moved between the cleaning unit 3 and the loading/unloading unit 4. The opening 14a can be closed by a shutter 15. The shutter 15 is closed while the cleaning unit 3 is in operation and is opened when carrying a wafer carrier C from the loading/unloading unit 4 into the cleaning unit 3 and when carrying a wafer carrier C from the cleaning unit 3 to the loading/unloading unit 4.

The wafer carrier cleaning unit 5 has a wafer carrier cleaning tank 16 to clean an empty wafer carrier C which has been emptied by unloading wafers W therefrom in the cleaning unit 3.

In the wafer carrier storage unit 6, empty wafer carriers C emptied by unloading wafers W to be cleaned therefrom are stored temporarily and empty wafer carriers C are stored therein to receive cleaned wafers W. A plurality of wafer carriers C can be stored in stacks. The wafer carrier storage unit 6 is provided with a wafer carrier moving mechanism for transporting a desired one of the plurality of wafer carriers C stored in the wafer carrier storage unit 6 to the stage 10 and for placing wafer carriers C at desired positions in the wafer carrier storage unit 6 for storage.

The cleaning unit 3 will be described with reference to FIGS. 3 to 5. Referring to FIG. 3, the cleaning unit 3 has a cleaning section 20, a wafer carrier stand-by section 30 disposed right under the cleaning section 20 to keep a wafer carrier C temporarily, and a wafer lifting mechanism 40 for raising wafers W from a wafer carrier C set in the wafer carrier stand-by section 30 to the cleaning section 20 and for returning the wafers W from the cleaning section 20 to the wafer carrier C kept on the wafer carrier stand-by section 30.

In the cleaning unit 3, wafers W are moved vertically through a doorway below the cleaning section 20 between the cleaning section 20 and the wafer carrier stand-by section 30. There is not any restrictions on a mechanism for moving wafers W; wafers W may be moved from above or from one side of the cleaning section 20 into the cleaning section 20.

A wafer carrier transporting mechanism 35 is provided for transporting the wafer carrier C between the stage 13 of the loading/unloading unit 4 and the wafer carrier stand-by section 30. The wafer carrier transporting mechanism 35 has a slide stage capable of moving between a first position right below the rotor 24 and a second position on the stage 13.

The wafer lifting mechanism 40 includes a wafer holding member 41 for holding wafers W, a vertical support bar 42 supporting the wafer holding member 41 and a driving device 43 for vertically moving the support bar 42 to raise and lower the wafer holding member 41. The driving device 43 moves the wafer holding member 41 vertically, whereby wafers W to be cleaned contained in a wafer carrier C kept in the wafer carrier stand-by section 30 (in other words, carrier C placed on the slide stage 32 positioned right below the rotor 24) move into the rotor 24. The wafer holding member 41 is also moved vertically by the driving device 43 to carry cleaned wafers W from the rotor 24 to the wafer carrier C kept in the stand-by section 30.

The cleaning section 20 removes a resist mask and an etch residue, such as fragments of a polymer layer, remaining on wafers W processed by an etching process. The cleaning section 20 includes a vertical support wall 18, a motor 23 having a drive shaft 23a and fixedly held on the support wall 18 in a horizontal position, the rotor 24 connected to the drive shaft 23a of the motor 23, a cylindrical support tube 25 surrounding the drive shaft 23a of the motor 23, an outer tubular member 26 supported on the support tube 25 so as to surround the rotor 24, and an inner tubular member 27 capable of being inserted in the outer tubular member 26.

The rotor 24 is capable of holding a plurality of horizontally arranged wafers W, for example, twenty-six or twenty-five wafers W, vertically. The rotor 24 is connected to the drive shaft 23a of the motor 23. The rotor 24 has retaining members 71a, 71b, 72a and 72b for retaining wafers W, and wafer holding members 83a and 83b for holding wafers W. The rotor 24 is rotated together with a plurality of wafers W held by the wafer holding members 83a and 83b by the motor 23. In FIGS. 4 and 5, the retaining members 71b and 72b are concealed behind the retaining members 71a and 72a, and the wafer holding member 83b is concealed behind the wafer holding member 83a.

The basic structure and operations of this apparatus is disclosed in co-pending U.S. patent application Ser. No. 09/635,465, the disclosure of which is incorporated herein by reference.

The outer tubular member 26 has a shape substantially resembling a frustum. The outer tubular member 26 can be horizontally moved between a working position indicated by two-dot chain lines in FIG. 3 around the rotor 24 and a back position indicated by continuous lines in FIG. 3 around the support tube 25. When wafers W are delivered to the rotor 24, the outer tubular member 26 is held at the back position shown in FIG. 3.

Figure 4:
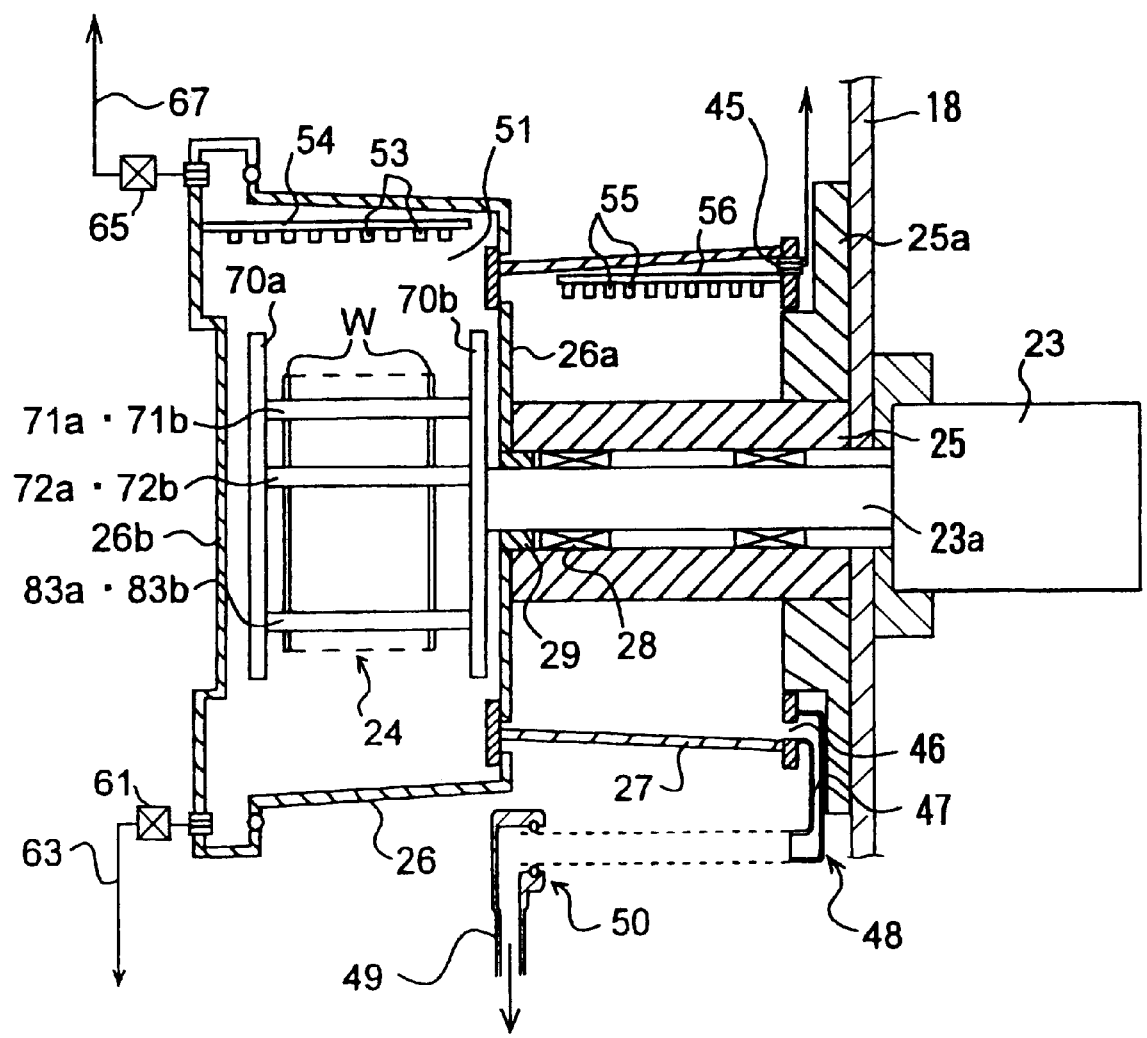
FIG. 4 is a sectional view of a cleaning section included in the cleaning unit shown in FIG. 3, in which an inner tubular member is positioned outside an outer tubular member.

Referring to FIG. 4, when the outer tubular member 26 is at the working position and the inner tubular member 27 is at its back position, a closed processing chamber 51 is formed by the outer tubular member 26, a vertical back wall 26a on the side of the motor 23, and a vertical front wall 26b on the front side of the outer tubular member 27. The vertical front wall 26b is provided in its lower part with a drain valve 61. A drain pipe 63 is connected to the drain valve 61 to drain a processing liquid from the processing chamber 51. The vertical front wall 26b is provided in its upper part with a discharge valve 65 to discharge gases and vapors of chemical liquids from the processing chamber 51.

A bottom portion of the outer tubular member 26 is sloped down from the vertical back wall 26a toward the vertical front wall 25b. Thus, the processing liquid used in the processing chamber 51 can be drained through the drain pipe 63.

The vertical back wall 26a is attached to the support tube 25 and the support wall 18. The drive shaft 23a is supported in bearings 28 on the support tube 25. A labyrinth seal 29 is formed between the vertical back wall 26a and a front end part of the support tube 25 to prevent particles produced by the motor 23 from entering the processing chamber 51 (52). A support member 25a is mounted on an end part of the support tube 25 on the side of the motor 23 to support the outer tubular member 26 and the inner tubular member 27 placed respectively at their back positions.

The inner tubular member 27 has a shape substantially resembling a frustum and has large and a small circular ends of diameters smaller than those of large and small circular ends of the outer tubular member 26. The inner tubular member 27 can be horizontally moved between a working position, where the inner tubular member 27 surrounds the rotor 24 as shown in FIG. 5, and a back position, where the inner tubular member 27 surrounds the support tube 25 as shown in FIGS. 3 and 4. Both the outer tubular member 26 and the inner tubular member 27 are held at their back positions when wafers W are carried to and carried away from the rotor 24. When the inner tubular member is held at the working position as shown in FIG. 5, a closed processing chamber 52 is formed by the inner tubular member 27, the vertical back wall 26a and the vertical front wall 25b.

Figure 6:
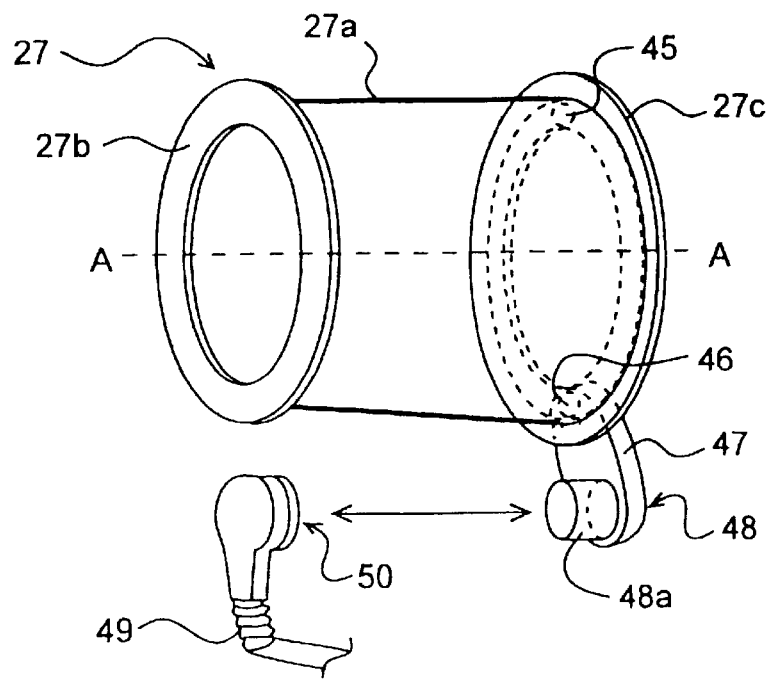
FIG. 6 is a perspective view of the inner tubular member shown in FIGS. 4 and 5.
Figure 7:
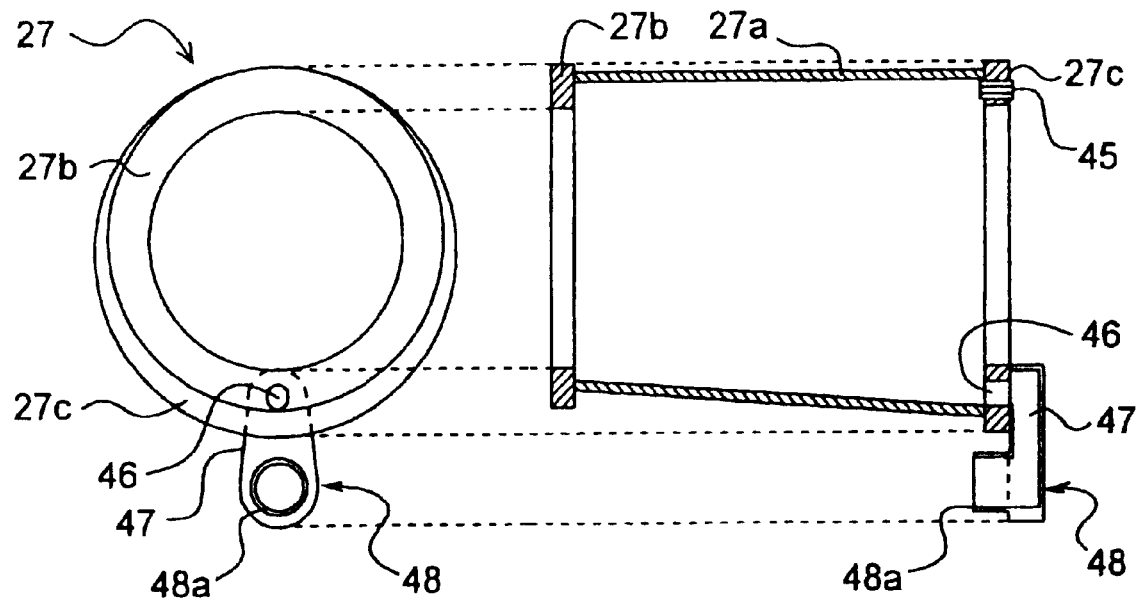
FIG. 7 is a front elevation and a sectional view of the inner tubular member shown in FIG. 6.

The inner tubular member 27 will be described with reference to FIGS. 6 and 7. In FIG. 6, a nozzle unit 56 is omitted.

The inner tubular member 27 has a body 27a and annular members 27b and 27c attached to the small and the large end, respectively, of the body 27a has a shape resembling a frustum formed by truncating an oblique circular cone. The inner tubular member 27 is set with the smaller end on the front side (on the side of the vertical front wall 26b, i.e., on the side of the working position) and the greater end on the back side (on the side of the motor 23, i.e., on the side of the back position). A bottom part of the body 27a slopes down from the annular member 27b toward the annular member 27c. A top part of the body 27a is horizontal.

When the inner tubular member 27 is located at the working position, the joint of the inner circumference of the annular member 27b and the vertical front wall 26b is sealed in an airtight fashion, and the joint of the annular member 27c and the vertical back wall 26a is sealed in airtight and watertight fashion.

Figure 5:
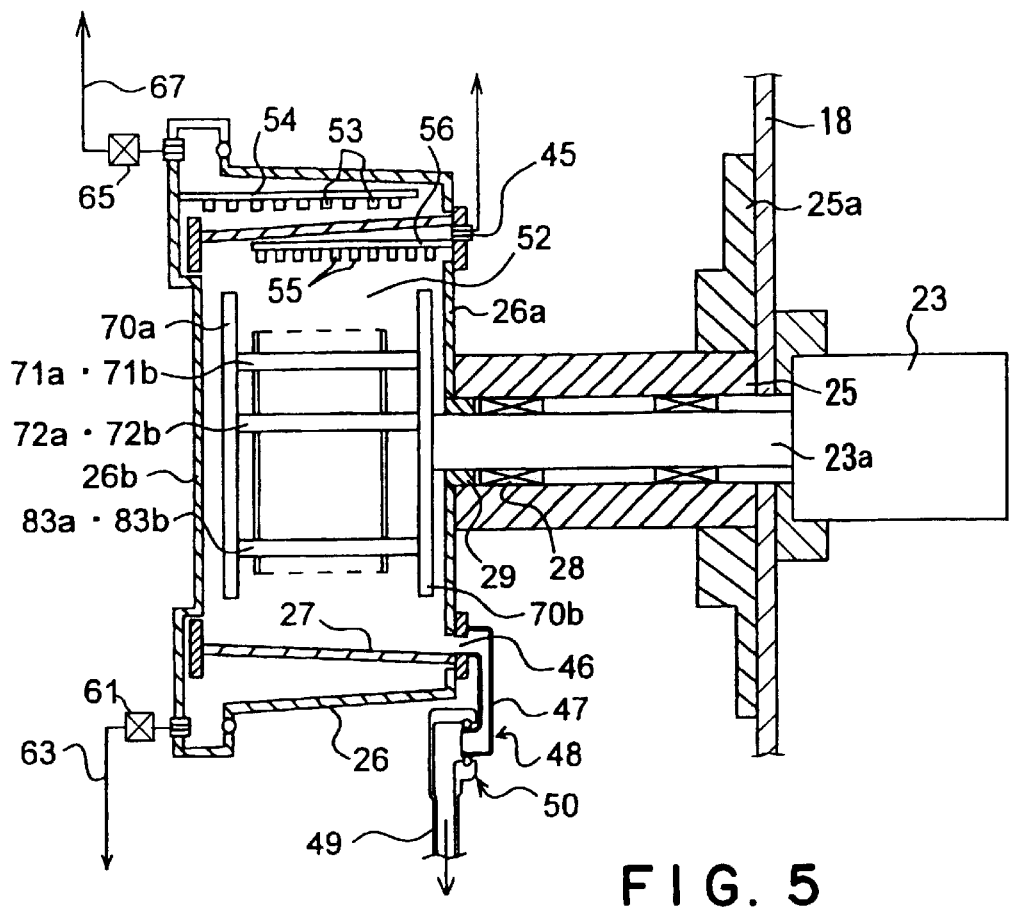
FIG. 5 is a sectional view of the cleaning section included in the cleaning unit shown in FIG. 3, in which the inner tubular member is positioned inside the outer tubular member.

The top part of the body 27a of the inner tubular member 27, as well as the bottom part, may be inclined as shown in FIG. 5; that is the body 27a of the inner tubular member 27 may be formed in a shape resembling a frustum formed by truncating a right circular cone. The inner tubular member 27 of the shape resembling a frustum formed by truncating a right circular cone has a greater end greater than that of the inner tubular member 27 of a shape resembling a frustum formed by truncating an oblique circular cone, and the former inner tubular member 27 is slightly greater than the latter.

Figure 14:
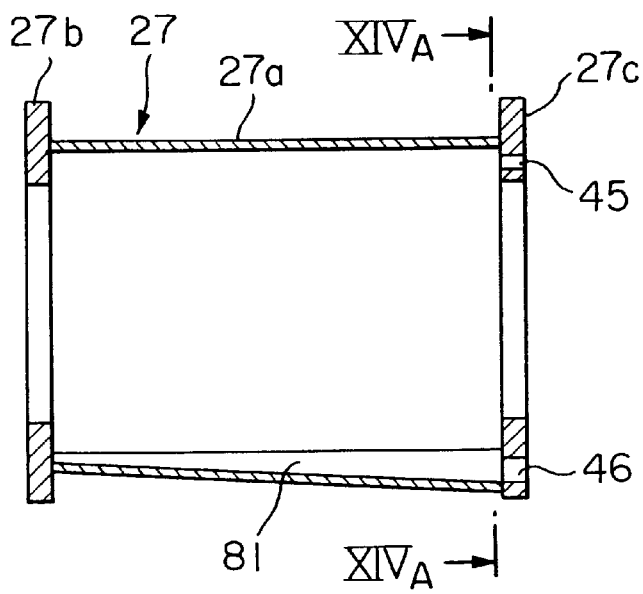
FIG. 14 is another inner tubular member provided with a drain channel.
Figure 14A:
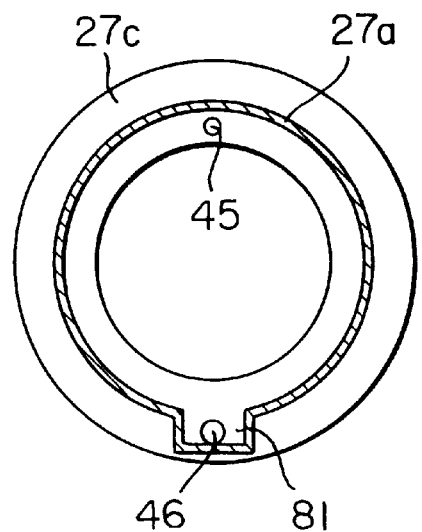
FIG. 14A is a sectional view taken on line XIVA—XIVA in FIG. 14.

The body 27a of the inner tubular member 27 may be formed in a cylindrical shape and a channel 81 sloping down from the side of the annular member 27b toward the side of the annular member 27c may be formed in a bottom portion of the body 27a as shown in FIGS. 14 and 14A.

The inclination of the bottom portion of the body 27a of the inner tubular member 27 may be properly determined taking into consideration the viscosity of the processing liquid to be used. Preferably, the inclination is 3 degree or above, more preferably, 5 degree or above, to enable various liquids including pure water to flow along the bottom portion of the body 27a. However, it is preferable that the inclination of the bottom portion of the body 27a is 10 degree or below because the uniformity of a cleaning atmosphere and a drying atmosphere in the processing chamber deteriorates and the size of the wafer cleaning system increases if the inclination of the bottom part of the body 27a is excessively large.

A bottom portion of the body 27a of the outer tubular member 26, as well as the bottom portion of the body 26a of the inner tubular member 26, maybe inclined. When the outer tubular member 26 is disposed with its larger end on the side of the vertical front wall 26b and its smaller end on the side of the motor 23 as shown in FIGS. 3 to 5, the drain valve 61 through which the processing liquid used in the processing chamber 51 is drained can be attached to a lower part of the vertical front wall 26b not lying inside the processing chamber 52. Similarly, the discharge valve 65 through which the atmosphere of the processing chamber 51 is discharged can be attached to an upper part of the vertical front wall 26b not lying inside the processing chamber 52.

A discharge port 45 is formed in an upper part of the annular member 27c and a discharge pipe, not shown, is connected to the discharge port 45. Gases are discharged through the discharge port 45 to adjust the atmosphere of the processing chamber 52 and to adjust the atmosphere of a space defined by the vertical back wall 26a, the support member 25a and the inner tubular member 27 located at its back position.

A drain port 46 is formed in a lower part of the annular member 27c. A first drain pipe 47, which is essentially rigid, is connected to the drain port 46. Since the bottom part of the body 27a of the inner tubular member 27 is inclined, the processing liquid can be easily collected around the drain port 46 and flows through the drain port 46 into the first drain pipe 47.

The first drain pipe 47 is extended downward. The first drain pipe 47A has a horizontal, cylindrical, straight pipe 48a is at the tip portion thereof. A second drain pipe 49, which is essentially rigid, is extended below the vertical back wall 26a. A pipe connector 50 is attached to the upper end of the second drain pipe 49 and the pipe 48a is fitted in the pipe connector 50.

The pipe 48 is disconnected from the pipe connector 50 when the inner tubular member 27 is moved to the back position. The pipe 48a is fitted in the pipe connector 50 in airtight and watertight fashion to drain the processing liquid when the inner tubular member 27 is moved to the working position to carry out a cleaning process for cleaning wafers W. Thus, the first drain pipe 47 is connected to the second drain pipe 49 to enable draining the processing liquid.

Figure 8:
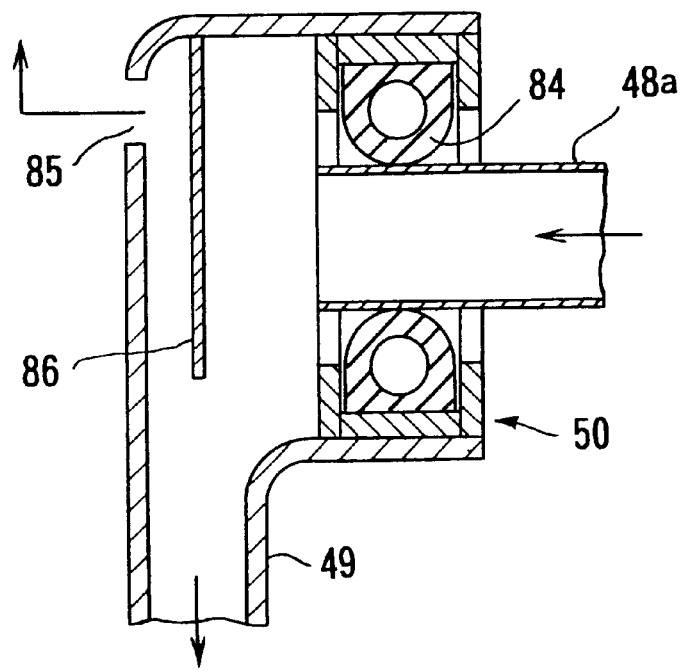
FIG. 8 is a sectional view of a joint joining a first drain pipe and a second drain pipe shown in FIGS. 6 and 7.

FIG. 8 is a sectional view of the joint of the pipe 48a and the pipe connector 50. The pipe connector 50 is provided with an annular flexible sealing member 84 having an interior space. The interior space of the sealing member 84 communicated with a fluid supply device (not shown). The sealing member 84 inflates to sealingly engage with the pipe 48a of the first drain pipe 47 when the not-shown fluid supply device supplies a pressurized fluid into the interior space of the sealing member 84, and deflates to disengage from the pipe 48a of the first drain pipe 47 and to allow the first drain pipe 47 to be disconnected from the second drain pipe 49.

A part of the second drain pipe 49 opposite the pipe connector 50 is provided with a discharge opening 85. Gases can be discharged through the discharge opening 85 while the processing liquid is being drained. A baffle plate 86 is disposed opposite to the discharge opening 85 to prevent the drained processing liquid from being discharged together with the gases through the discharge opening 85.

The draining means including the first drain pipe 47 and the second drain pipe 49 that can be disconnected from the drain pipe 47 ensures satisfactory draining and reduces space necessary for installing the wafer cleaning system. If a continuous draining means, such as a flexible pipe, is connected to the inner tubular member 27, the flexible pipe moves together with the inner tubular member 27. Therefore, problems in the mechanical durability of the flexible pipe arise, the flexible pipe needs a large space and the size of the wafer cleaning system increases accordingly. This embodiment is free from such problems.

Figure 15:
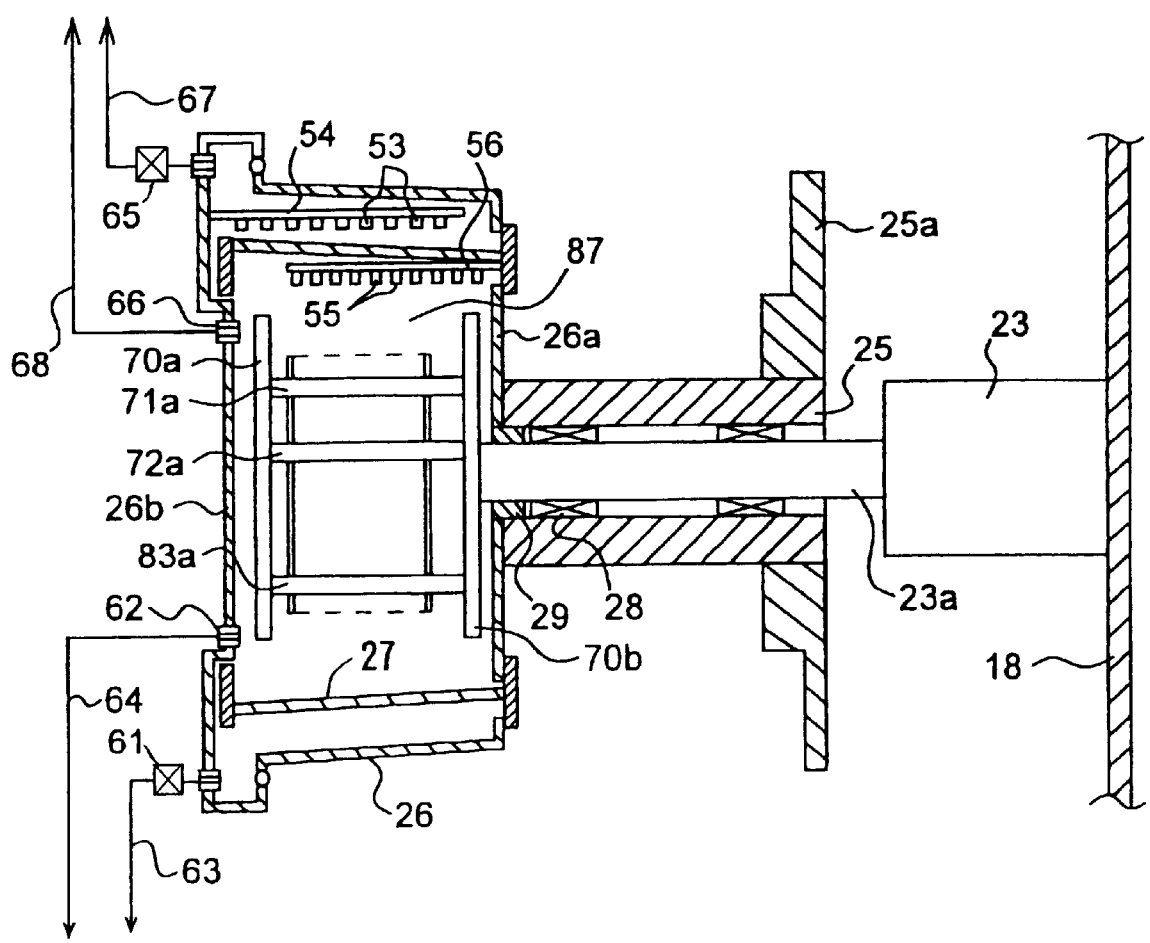
FIG. 15 is a sectional view of a cleaning section disclosed in the previously filed co-pending U.S. patent application on which the present invention is based.
Figure 16:
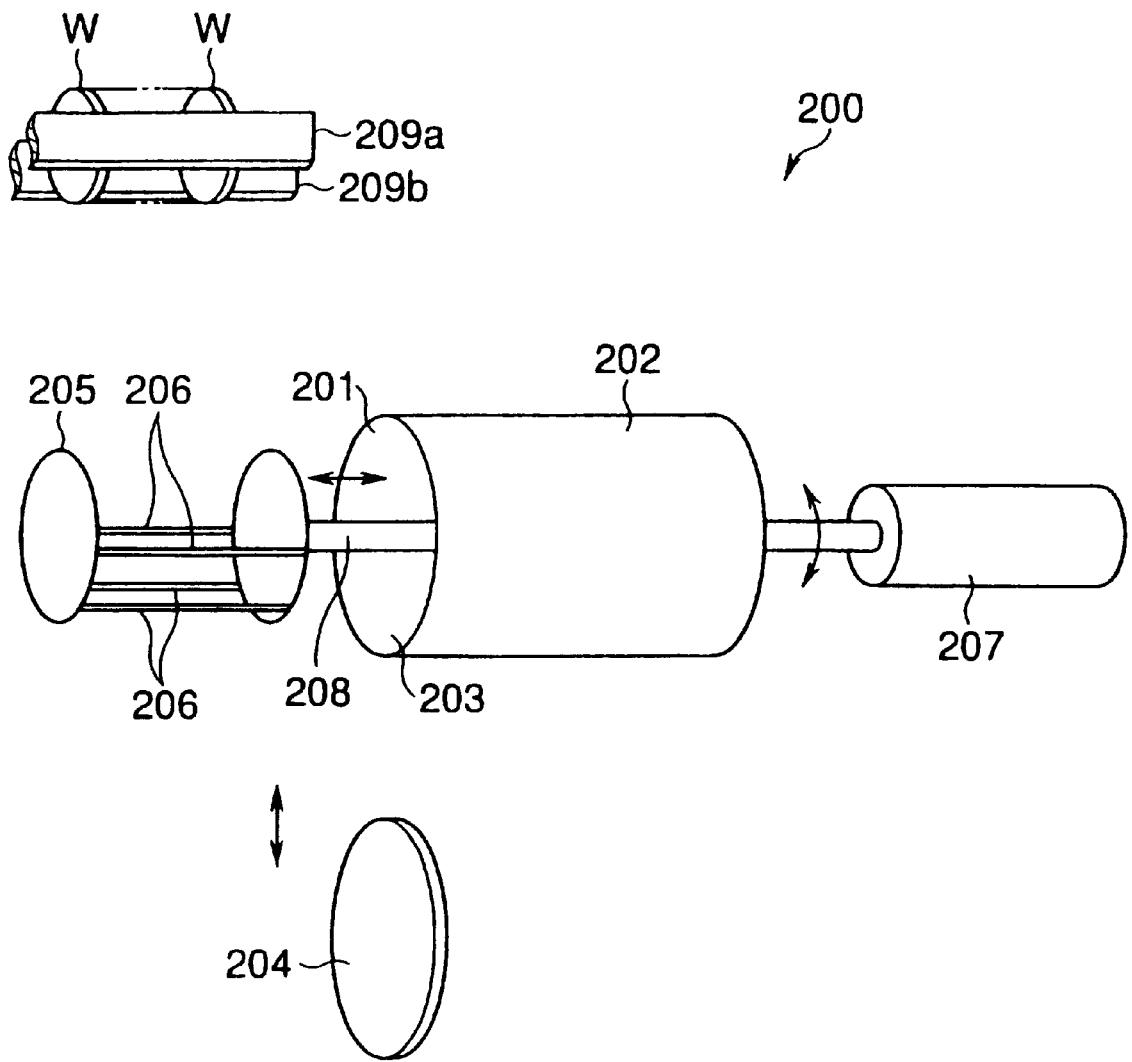
FIG. 16 is a schematic perspective view of a conventional cleaning unit.

In a structure shown in FIG. 15, (i) the inner tubular member 27 is disposed with the large end on the side of the vertical front wall 26b and the bottom part of the body 27a sloped down toward the vertical front wall 26b, and (ii) a drain valve 62 is attached to a part of the vertical front wall 26b in a lower part of a processing chamber 87 formed when the inner tubular member 27 is located at the working position and a drain pipe 64 is connected to the drain valve 62. Suppose that wafers are processed by the structure shown in FIG. 15 by locating the outer tubular member 26 and the inner tubular member 27 at their working positions, carrying out a firs process using a first processing liquid to process the wafers in the processing chamber 87 formed in the inner tubular member 27, moving the inner tubular member 27 to the back position, and then carrying out a second process using a second processing liquid to process the wafers in the processing chamber 51 formed in the outer tubular member 26. In this case, the drain valve 62 is exposed to the processing chamber 51 formed in the outer tubular member 26 and the first processing liquid remaining in the drain valve 62 diffuses into the processing chamber 51. Consequently, it takes much time for the adjustment of the atmosphere in the processing chamber 51 that must be accomplished after the end of the first process before starting the second process. A draining structure shown in FIGS. 4 to 8 avoids such a problem.

In the draining structure shown in FIGS. 4 to 8, it is preferable to open a stop valve connected to the pipe 48a of the first drain pipe 47 when the pipe 48a is fitted in the pipe connector 50 attached to the second drain pipe 49 and to close the stop valve when the pipe 48a is disconnected from the pipe connector 50. Thus, the dripping of the processing liquid from the pipe 48a can be prevented.

A trough 57 for receiving the processing liquid dripped from the pipe 48a connected to the first drain pipe 47 may be disposed below the pipe 48a as shown in FIG. 9 instead of providing the pipe 48a with a valve. The processing liquid dripped from the pipe 48a is collected in the trough 57 and does not wet the components of the wafer cleaning system. Since the trough 57 moves together with the first drain pipe 47, an operation for carrying wafers W is not hindered by the trough 57. A trough may be disposed below the pipe connector 50 attached to the second drain pipe 49 to receive the processing liquid dripped from the pipe connector 50.

Another possible draining structure will be described hereinafter. FIG. 10 shows a draining structure employing a stretchable bellows 58 having one end connected to the free end of the first drain pipe 47 connected to the inner tubular member 27 and the other end connected to the free end of the second drain pipe 49. The bellows 58 contracts when the inner tubular member 27 is moved to the working position and stretches when the inner tubular member 27 is moved to the back position. The draining structure shown in FIG. 10 does not permit the processing liquid to drip and hence needs neither a stop valve nor a trough.

A third possible draining structure will be described with reference to FIGS. 11, 11A and 11B. A first drain pipe 47A, which is essentially rigid, is arranged and bent at a plurality of parts so that the first drain pipe 47A does not underlie the outer and inner tubular members 26, 27. The first drain pipe 47A has a tip part 75 arranged obliquely below the inner tubular member 27 and extending in parallel to the direction in which the inner tubular member 27 slides. The tip part 75 of the first drain pipe 47A is inserted into a second drain pipe 76, which is essentially rigid. As shown in FIG. 11B, a pipe connector 50 similar to that shown and previously described with reference to FIG. 8 is attached to the free end of the second drain pipe 76. Although the length of a section of the part 75 of the first drain pipe 47A inserted in the second drain pipe 76 varies according to the position of the inner tubular member 27, the part 75 of the first drain pipe 47A is always overlapped with a pipe connector 50 of the second drain pipe 76.

A discharge valve 90 is attached to a top portion of the second drain pipe 76 and a discharge pipe 91 is connected to the discharge valve 90. A pan 92 is disposed under the tip part 75 of the first drain pipe 47A and an end part of the second drain part 76. If the drained processing liquid that wets the outer surface of the pipe 48a of the first drain pipe 47 falls, the liquid is received by the pan 92 to prevent wetting the component parts of the wafer cleaning apparatus with the drained processing liquid.

Figure 11:
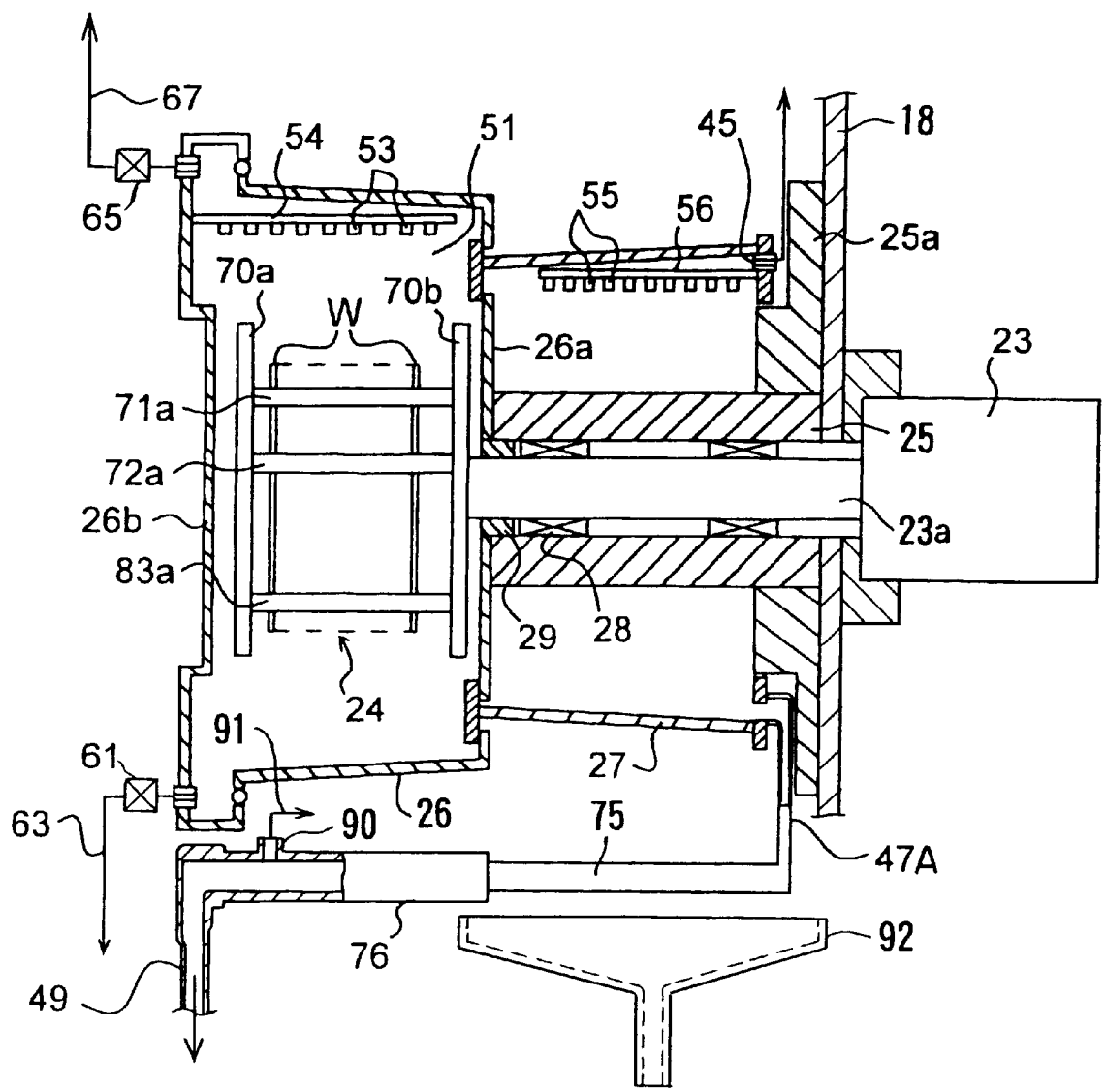
FIG. 11 is a sectional view of another embodiment of the cleaning section, in which a first drain pipe is fitted in a second drain pipe.
Figure 11A:
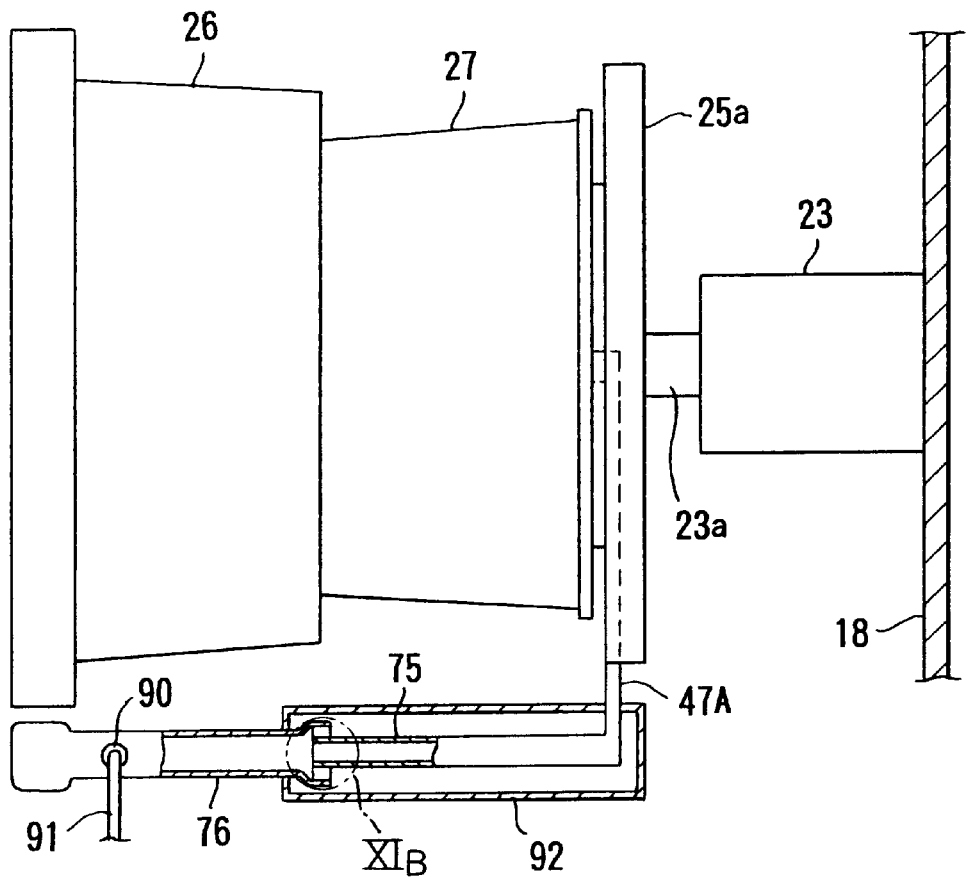
FIG. 11A is a plan view of the cleaning section shown in FIG. 11 taken in the direction of the arrow XIA.
Figure 11B:
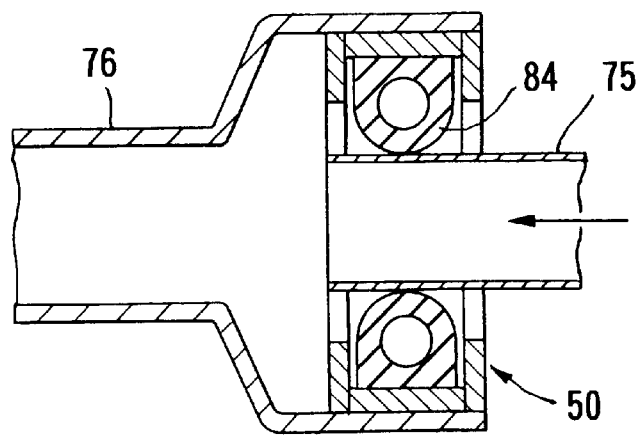
FIG. 11B is a sectional view of a joint of the first and the second drain pipe shown in FIG. 11.
Figure 12:
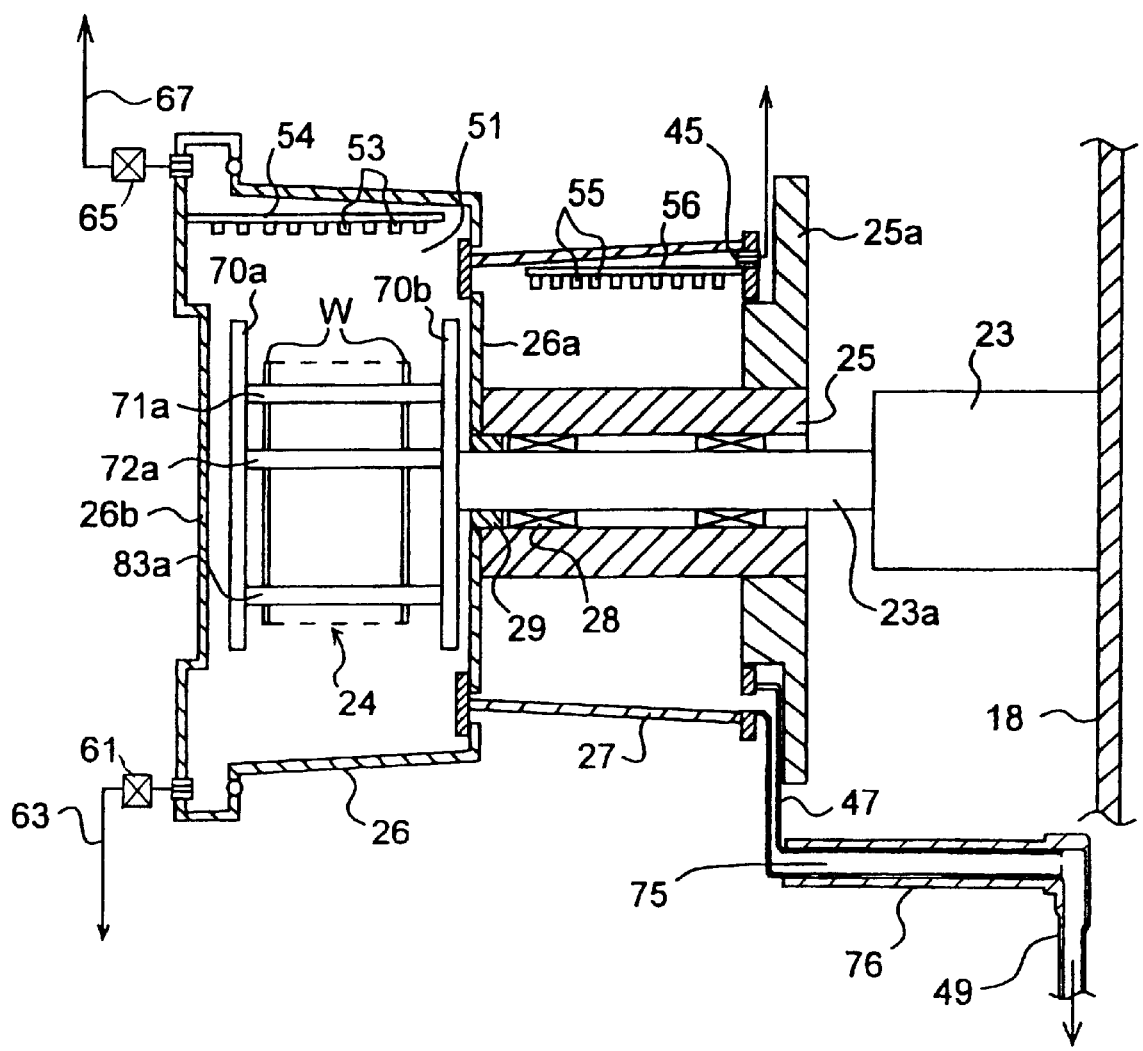
FIG. 12 is a sectional view of another modification of the cleaning section shown in FIG. 11.

In the draining structure shown in FIGS. 11, 11A and 11B, since the first drain pipe 47A is always inserted into the second drain pipe 49, the leakage of processing liquid is minimized. Since the draining structure does not have any flexible tube, the draining structure is excellent in durability. Since the first drain pipe 47A and the second drain pipe 76 are not extended right below the rotor 24 and are extended outside the moving range of the outer tubular member 26 and the inner tubular member 27, the operations for mounting wafers on the rotor 24 from the wafer carrier C positioned as shown in FIG. 3 and for removing the wafers from the rotor 24 are not hindered at all by the first drain pipe 47A and the second drain pipe 76. The drain pipes 47A and 76 do not need necessarily to be disposed as shown in FIG. 11; the same may be disposed near the back position of the inner tubular member 27 as shown in FIG. 12.

As shown in FIG. 11C, a tube 93 surrounding the first drain pipe 47A may be provided instead of the pan 92. The tube 93 is configured so that, when the inner tubular member 27 is positioned at the back position, the tip portion of the tube overlaps with the tip portion of the second drain pipe 76. The tube is provided with an exhaust port 93a at the top portion thereof and a drain port 93b at the bottom portion thereof. The ports 93a, 93b is arranged so that, when the inner tubular member 27 is positioned at the back position, the ports 93a, 93b locate at a position slightly shifted from the tip of the second drain pipe 76 toward the side of the first drain pipe 47A, as shown in FIG. 1C. The arrangement of the ports 93a, 93b is based on the fact that the area L of the first drain pipe 47A tends to wet by the processing liquid.

Nozzle units that discharges the processing liquids into the processing chamber and preferable positions of the same will be described. Referring to FIGS. 4 and 5, a nozzle unit 54 for the processing chamber 51 has a header pipe held in a horizontal position on the vertical front wall 26b, and a plurality of nozzles 53 respectively having discharge openings and arranged at intervals on the header pipe. A nozzle unit 54 for the processing chamber 52 has a header pipe held in a horizontal position on the annular member of the inner tubular member 27, and a plurality of nozzles 55 respectively having discharge openings and arranged at intervals on the header pipe.

Pure water, IPA, $N_2$ gas and various chemical liquids supplied from liquid sources, not shown, can be sprayed by the nozzle unit 54. Pure water, IPA and various chemical liquids supplied from liquid sources, not shown, can be sprayed by the nozzle unit 56.

Figure 13:
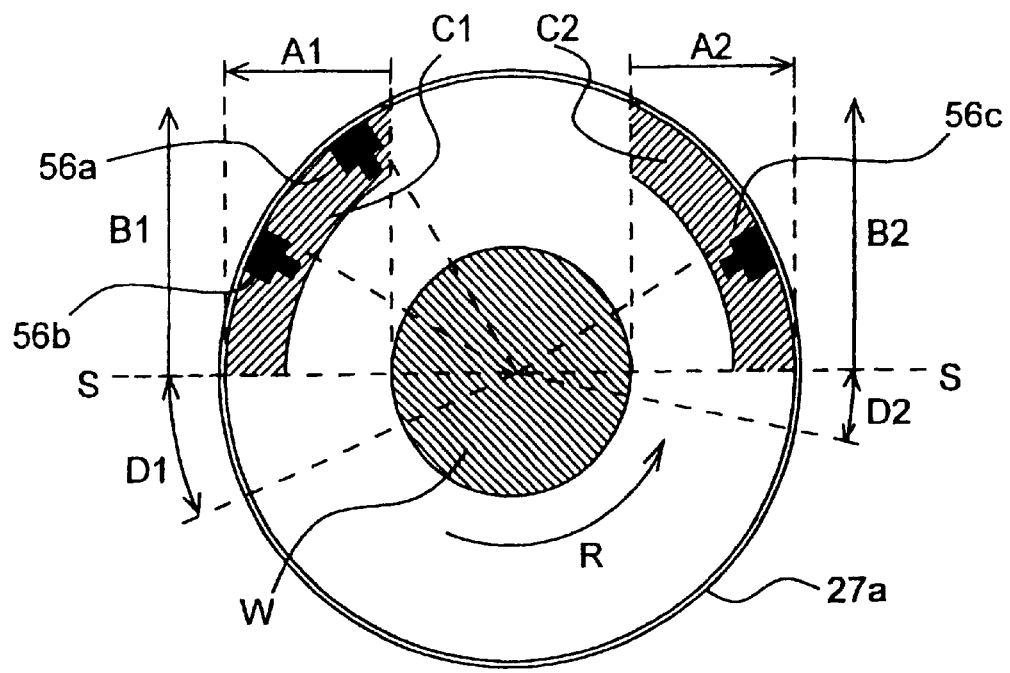
FIG. 13 is a view of assistance in explaining the disposition of nozzle pipes in the inner tubular member shown in FIG. 7.

FIG. 13 is a front elevation of the inner tubular member 27 of assistance in explaining the position of the nozzle unit 56 (56a to 56c) in the inner tubular member 27, in which annular members 27b and 27c and the rotor 24 for holding wafers are omitted for simplicity. Preferably, the nozzle unit 56 for spraying the processing liquid on wafers W held on the rotor 24 is disposed in the processing chamber 52 in a region above a horizontal, diametrical plane indicated by a doted line SS in FIG. 13 (refer to the arrows B1 and B2) and radially outside vertical lines passing the intersection of the horizontal line SS and the outer edge of the wafer W (refer to the arrows A1 and A2). Preferably, the nozzle unit 56 is radially spaced a short distance from the wafers W in order that the processing liquid can be uniformly sprayed on the wafers W through the nozzles 55. Thus, suitable regions for the nozzle unit 56 are hatched regions C1 and C2 in FIG. 13, which applies similarly to suitable regions for the nozzle unit 54 in the processing chamber 51.

When the nozzle units 54 and 56 are disposed in such a suitable region in the processing chambers 51 (52), respectively, the wafers W are not wetted with the processing liquid that leak or drip from the nozzles 53 (55). Thus, formation of liquid stains on the wafers W can be avoided even if the processing liquid leaks or drips from the nozzles 53 (55) after the spraying of the processing liquid has been stopped.

Since the rotor 24 holding the wafers W is rotated in the processing chamber 51 (52), turning air currents turning in the rotating direction of the wafers W are produced. When drying the wafers W without spraying any processing liquid by the nozzle unit 54 (56), it is possible that the processing liquid wetting the nozzles 53 (55) of the nozzle unit 54 (56) is scattered by the turning air currents, and form liquid stains on the wafers W to make the wafers W defective.

Suppose that the rotor 24 holding the wafers W is rotated counterclockwise as indicated by the arrow R in FIG. 13 by the motor 23. Then, the nozzle units 56a and 56b disposed in the hatched region C1 do not form any liquid stains on the wafers W by the processing liquid dripped from the nozzle units 56a and 56b whether the wafers W are rotated or not. In FIG. 13, for example, the nozzle units 56a and 56b are disposed at angles of about 60° and about 30°, respectively, measured in a clockwise direction from the dotted line SS. Those angles, however, are dependent on the inside diameter of the body 27a, the diameter of the wafers W to be processed, and the respective shapes of the nozzle units 56a and 56b.

It is preferable to dispose the nozzle unit on the lower side with respect to the flowing direction of the air currents generated by the rotating wafers W in the upper half of the processing chamber 52, for example, the nozzle unit 56c disposed in the region C2 in FIG. 13, at a position in the lower half of the region C2, for example at an angle of about 30° measured clockwise from the dotted line SS, so that the processing liquid wetting the nozzle unit 56c will fall down and does not wet the wafers W even if the processing liquid wetting the nozzle unit 56c is blown off the nozzle unit 56c by the air currents.

Although it is preferable to dispose the nozzle units 56 in the regions C1 and C2, the nozzle units 56 may be disposed in narrow angular ranges D1 and D2 of, for example, 0° to about 10° downward from the dotted line SS, provided that the nozzle units 56 do not blow up the processing liquid flowing down along the wafers W. In this case, it is preferable that the angular range D2 is narrower than the angular range D1 in view of the generation of air currents by the rotating wafers W.

Although the invention has been described in its preferred embodiments, the present invention is not limited thereto in its practical application and various changes and variations are possible. For example, the wafer cleaning system may have three or more processing chambers or a single processing chamber instead of the two processing chambers formed by the outer tubular member 26 and the inner tubular member 27. Either of the outer tubular member 26 and the inner tubular member 27 may be used for cleaning or drying. A cleaning process and a drying process may be continuously carried out. Although the invention has been described as applied to a wafer cleaning system, the present invention is applicable to a processing system for both cleaning and drying. The present invention is applicable to a coating system for applying a liquid to workpieces. The processing system of the present invention is applicable not only to processing semiconductor wafers but also processing other substrates, such as those for liquid crystal displays (LCDs).

What is claimed is:

1. A processing apparatus for processing an object with processing liquid, comprising:
    a holder that holds the object;
    an enclosing element capable of moving between a first position where the enclosing element surrounds the holder and forms a closed processing chamber in which the object is processed and a second position where the enclosing element is withdrawn from around the holder, the enclosing element having a first end on a side of the first position and a second end on a side of the second position, and the enclosing element being provided with a drain port, through which the processing liquid is drained, at a lowermost portion of the second end of the enclosing element;
    a first drain pipe connected to the drain port; and
    a nozzle that supplies the processing liquid into the processing chamber.

2. The processing apparatus according to claim 1, wherein the drain pipe moves together with the enclosing element, said apparatus further comprising:
    a second drain pipe capable of receiving the processing liquid drained through the first drain pipe connected to the drain port, wherein the positional relationship between the first drain pipe and the second drain pipe changes according to a movement of the enclosing element.

3. The processing apparatus according to claim 2, wherein one of the first and second drain pipes are movably received in the other, and wherein a length of parts of the first and the second drain pipe overlapping each other varies according to the movement of the enclosing element.

4. The processing apparatus according to claim 3, wherein the first drain pipe is received in the second drain pipe, and wherein the second drain pipe is provided with an exhaust port at a top portion thereof, the exhaust port being arranged so that, when the enclosing element is positioned at the first position, the exhaust port is positioned adjacent to a tip of the first drain pipe.

5. The processing apparatus according to claim 3, wherein the first drain pipe is received in the second drain pipe, said apparatus further comprising:
    a tube surrounding the first drain pipe, the tube being provided with a drain port at a bottom portion thereof and an exhaust port at a top portion thereof.

6. The processing apparatus according to claim 3, wherein the first and the second drain pipes are capable of engaging in a watertight fashion.

7. The processing apparatus according to claim 2 further comprising a drain receiving member configured to receive the processing liquid that falls from the drain pipes, wherein the drain receiving member is arranged so that, when the enclosing element is positioned at the second position, the drain receiving member is located below the first drain pipe.

8. The processing apparatus according to claim 2, wherein the first drain pipe is connected to the second drain pipe when the enclosing element is positioned at the first position and is disconnected from the second drain pipe when the enclosing element is positioned at the second position.

9. The processing apparatus according to claim 2, wherein the first and the second drain pipes are connected by a stretchable bellows.

10. The processing apparatus according to claim 1, wherein the enclosing element is a tubular having an axis extending in a horizontal direction and in a moving direction of the enclosing element.

11. The processing apparatus according to claim 10, wherein an inner surface of a bottom portion of the enclosing element is sloped down from the first end toward the second end.

12. The processing apparatus according to claim 1, wherein the enclosing element includes;
    a cylindrical part having an axis extending in a horizontal direction and in a moving direction of the enclosing element; and
    a channel arranged at a lowermost portion of the cylindrical part and extending between the first end and the second end, the channel having a bottom wall sloped down from the first end toward the second end.

13. The processing apparatus according to claim 1, wherein an inner surface of a bottom portion of the enclosing element is sloped down from the first end toward the second end.

14. The processing apparatus according to claim 13, wherein the enclosing element has a shape resembling a frustum formed by truncating an oblique circular cone, the oblique cone having a first generator located at an uppermost portion of the cone and extending horizontally and a second generator located at a lowermost portion of the cone and sloped down from the first end toward the second end.

15. The processing apparatus according to claim 1 further comprising a second enclosing element capable of moving between a first position where the second enclosing element surrounds the holder and forms a second closed processing chamber in which the object is processed and a second position where the second enclosing element is withdrawn from around the holder, the second enclosing element being capable of enclosing the first enclosing element.

16. The processing apparatus according to claim 1, wherein the object has a shape of a circular disc, and wherein, as viewed in a direction of a center axis of the disk when the object is held by the holder, the nozzle is arranged in the processing chamber in a region above a horizontal diametrical line passing a center of the disk and outside of a vertical line passing intersection of the horizontal diametrical line and a periphery of the object.

17. The processing apparatus according to claim 1, wherein the enclosing element is a tubular member having an axis extending in a substantially horizontal direction and in a moving direction of the enclosing element, is sloped down, at an angle of not less than 3 degrees with respect to a horizontal plane, from the first end toward the second end.

18. A processing apparatus for processing an object with a processing liquid, comprising:
  a holder adapted to hold the object; and
  an enclosing element adapted to surround the holder to define a closed processing chamber, in which the object held by the holder is processed;
  wherein the enclosing element includes:
    a cylindrical body having a center axis extending in a horizontal direction; and
    a channel-forming member provided at a lowermost portion of the cylindrical body to define a channel into which the processing liquid is collected, the channel extending in an axial direction of the cylindrical body, and the channel-forming member having a first end and a second end and having a bottom sloping downward toward the second end, and
  wherein the enclosing element is provided with a drain port arranged adjacent to the second end of the channel to drain the processing liquid from the processing chamber.

19. The processing apparatus according to claim 18, wherein the object has a shape of a circular disk, said apparatus further comprising:
  a nozzle that supplies the processing liquid into the processing chamber, wherein, as viewed in a direction of a center axis of the disk when the object is held by the holder, the nozzle is arranged in the processing chamber in a region above a horizontal diametrical line passing a center of the disk and outside of a vertical line passing an intersection of the horizontal diametrical line and a periphery of the object.

20. The apparatus according to claim 18, wherein an inclination of the bottom of the channel-forming member is 3 to 10 degrees.

21. The apparatus according to claim 18, wherein an inclination of the second generator of the channel-forming member is 3 to 10 degrees.

22. A processing apparatus for processing an object with a processing liquid, comprising:
  a holder adapted to hold the object; and
  an enclosing element adapted to surround the holder to define a closed processing chamber, in which the object held by the holder is processed;
  wherein:
    the enclosing element includes a body having an oblique, circular, truncated cone shape, the body having a first circular end of relatively small diameter and a second circular end of a large diameter relative to the first circular end;
    the body is configured and arranged so that a first generator of the cone located at an uppermost portion of the body extends in a horizontal direction, and a second generator of the cone located at an lowermost portion of the body slopes downward from the first end toward the second end; and
    the enclosing element is provided with a drain port arranged adjacent to a lowermost portion of the second end of the body to drain the processing liquid from the processing chamber.

23. The apparatus according to claim 22, wherein the object has a shape of a circular disk, said apparatus further comprising:
  a nozzle that supplies the processing liquid into the processing chamber, wherein, as viewed in a direction of a center axis of the disk when the object is held by the holder, the nozzle is arranged in the processing chamber in a region above a horizontal diametrical line passing a center of the disk and outside of a vertical line passing an intersection of the horizontal diametrical line and a periphery of the object.

* * * * *